United States Patent
Hoffman et al.

(10) Patent No.: US 8,101,947 B2
(45) Date of Patent: Jan. 24, 2012

(54) SYSTEM AND METHOD FOR MANUFACTURING A THIN-FILM DEVICE

(75) Inventors: Randy Hoffman, Corvallis, OR (US); Gregory Herman, Camas, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 67 days.

(21) Appl. No.: 12/375,660

(22) PCT Filed: Jul. 26, 2007

(86) PCT No.: PCT/US2007/074397
§ 371 (c)(1), (2), (4) Date: May 5, 2009

(87) PCT Pub. No.: WO2008/016818
PCT Pub. Date: Feb. 7, 2008

(65) Prior Publication Data
US 2009/0289250 A1    Nov. 26, 2009

(51) Int. Cl.
*H01L 29/12* (2006.01)
*H01L 21/00* (2006.01)

(52) U.S. Cl. ............... 257/43; 257/49; 257/66; 257/69; 438/149; 438/151

(58) Field of Classification Search ............ 257/43, 257/49, 66, 691; 438/149, 151
See application file for complete search history.

(56) References Cited

U.S. PATENT DOCUMENTS

| | | | |
|---|---|---|---|
| 5,583,369 A | 12/1996 | Yamazaki et al. | |
| 2005/0269562 A1 | 12/2005 | Yang et al. | |
| 2006/0079034 A1 | 4/2006 | Hoffman et al. | |
| 2008/0303037 A1* | 12/2008 | Irving et al. | 257/88 |

FOREIGN PATENT DOCUMENTS

| WO | 2006094231 | 9/2006 |
|---|---|---|
| WO | 2006094241 | 9/2006 |

OTHER PUBLICATIONS

Kucheyev; "Implant Isolation of ZnO"; Journal of Applied Physics, vol. 93, No. 5; Mar. 1, 2003.

* cited by examiner

*Primary Examiner* — Long Pham

(57) ABSTRACT

A thin-film device includes a plurality of circuit components defining an operational region of the thin-film device, an unpatterned channel portion (108, 340) disposed on the plurality of circuit components, and a patterned passivation dielectric (380,385) selectively disposed on the unpatterned channel portion (108, 340) to electrically pattern an active region of the unpatterned channel portion (108,340).

16 Claims, 3 Drawing Sheets

SYSTEM AND METHOD FOR MANUFACTURING A THIN-FILM DEVICE

RELATED APPLICATIONS

The present application is a U.S. nationalization of a PCT application (PCT/US/2007/074397) that was filed Jul. 26, 2007. This PCT application claims priority to an earlier U.S. application Ser. No. 11/496,768 that was filed Jul. 31, 2006.

BACKGROUND

Electronic devices, such as integrated circuits, sensor arrays, or electronic displays, for example, may be comprised of one or more thin-film devices, such as one or more thin-film transistors (TFTs). Methods or materials utilized to form thin-film devices such as these may vary, and one or more of these methods or materials may have particular disadvantages. For example, use of such methods or materials may be time-consuming or expensive, may involve the use of high temperature processing, or may not produce devices having the desired characteristics. Further, many methods are utilized to limit parasitic effects that are created at the time of fabrication, (e.g., unintended metal-insulator-semiconductor [MIS] structures beneath conductive interconnect lines, or unwanted current leakage between adjacent circuit elements) which may negatively impact the functionality of the final device.

SUMMARY

An exemplary thin-film device includes a plurality of thin-film device components defining an active region of the thin-film device, an unpatterned channel portion disposed on the plurality of thin-film device components, and a patterned passivation dielectric selectively disposed on the unpatterned channel portion to electrically pattern an active region of the unpatterned channel portion.

A method of spatially selecting active/inactive regions of a thin-film device channel film includes disposing a patterned passivation dielectric on an unpatterned channel layer, wherein the patterned passivation dielectric includes at least two passivation dielectrics.

BRIEF DESCRIPTION OF THE DRAWINGS

The accompanying drawings illustrate various embodiments of the present system and method and are a part of the specification. The illustrated embodiments are merely examples of the present system and method and do not limit the scope thereof.

Throughout the drawings, identical reference numbers designate similar, but not necessarily identical, elements.

DETAILED DESCRIPTION

An exemplary system and method for forming spatially selective active/inactive regions of an unpatterned TFT channel film using patterned passivation dielectric is disclosed herein. According to one exemplary method, a patterned passivation dielectric layer is deposited and selectively patterned over a back surface of an unpatterned channel film, to spatially define a TFT channel region. Additionally, an unpatterned dielectric layer is coated over the patterned passivation dielectric layer and the unpatterned channel layer to electrically isolate adjacent TFTs. In combination, these layers act to electrically pattern the unpatterned channel film. Embodiments and examples of the present exemplary systems and methods will be described in detail below.

Unless otherwise indicated, all numbers expressing quantities of ingredients, reaction conditions, and so forth used in the specification and claims are to be understood as being modified in all instances by the term "approximately." Accordingly, unless indicated to the contrary, the numerical parameters set forth in the following specification and attached claims are approximations that may vary depending upon the desired properties sought to be obtained by the present disclosure.

Additionally, as used herein, and in the appended claims, the term "semiconductor", "semiconducting", or "semiconductive" shall be understood to mean any material whose conductivity can be modulated (such as by doping the material, or by application of an external electric field, such as in a field-effect transistor structure) across a relatively broad range, typically several orders of magnitude. Consequently, as used herein, a "good" or "useful" semiconductor is a material with relatively high carrier mobility, relatively low defect (trap) density, and relatively low carrier concentration without the presence of external influence, such as thin-film transistor (TFT) gate voltage. A relatively low carrier concentration, in this context, implies a carrier concentration substantially lower than that of a typical metallic conductor, for which a typical carrier concentration is about $10^{21}$ carriers per cubic centimeter. More specifically, in order to function acceptably as a TFT channel material, a carrier concentration below about $10^{18}$ carriers per cubic centimeter is desired.

As used herein, the terms "conductor", "conducting", or "conductive" are meant to be understood as any material which offers relatively low resistance or opposition to the flow of electric current due to relatively high mobility and relatively high carrier concentration.

Figure 2:
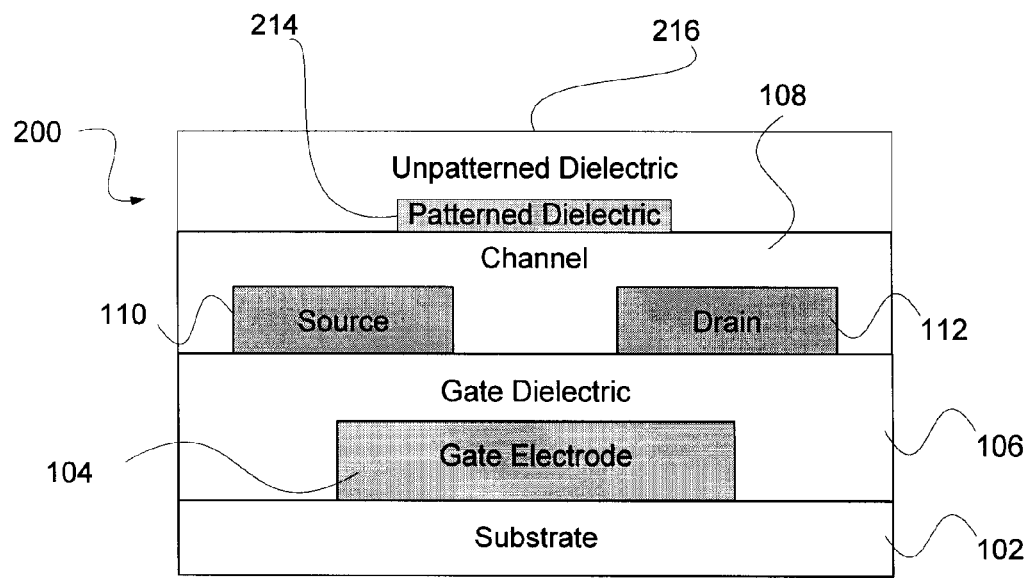
FIG. 2 illustrates a side cross-sectional view of a semiconductor device with patterned and unpatterned spatially isolating films deposited, according to one exemplary embodiment.

It should also be understood that various semiconductor devices such as transistor structures may be employed in connection with the various embodiments of the present exemplary systems and methods. For example, the present systems and methods may be incorporated to form any number of semiconductor structures, field-effect transistors including thin-film transistors (TFTs), active-matrix displays, logic inverters, amplifiers, and the like. As illustrated in FIG. 2, exemplary thin-film transistor embodiments may be formed with the present systems and methods. The thin-film transistors can be of any type including, but not limited to, horizontal, vertical, coplanar electrode, staggered electrode, top-gate, bottom-gate, single-gate, and double-gate transistors, just to name a few.

Electronic devices, such as display devices, nanotechnology devices, and sensor devices, for example, may include one or more electronic components. The one or more electronic components may further include one or more thin-film components, which may be formed of one or more thin films. As used in the present specification and the appended claims, the term "or" means a sentential connective that forms a complex sentence which is true when one or more of its constituent sentences is true. Additionally, as used herein, the term "thin film" refers to a layer of one or more materials formed to a thickness, such that surface properties of the one or more materials may be observed, and these properties may vary from bulk material properties. Thin films may additionally be referred to as component layers, and one or more component layers may comprise one or more layers of material, which may be referred to as material layers, for example. The one or more material or component layers may have electrical or chemical properties, such as conductivity, chemical interface properties, charge flow, or processability.

At least as part of the fabrication process of thin-film components, such as thin-film transistors, one or more layers of material may be formed at least as part of one or more of the component layers, such as by forming at least a portion of an electrode, including: source, drain, or gate electrodes; a channel layer; and/or a dielectric layer. These one or more layers of material may be formed on or over a substrate, for example.

In at least one exemplary embodiment, one or more processes utilized may include a patterned deposition of a dielectric material. As used herein, patterning refers to one or more processes that create a predetermined shape, i.e., feature, on the surface of the substrate. For example, processes that may be utilized to form material layers of a TFT may use a combination of photoresist, laminates, and photolithography to create the desired feature or features. Using these tools and procedures provides the means for electrically separating the TFTs through the deposition and patterning of dielectric material. By contrast unpatterned deposition has no predetermined features and instead creates a continuous layer across the surface of a substrate. An unpatterned layer may comprise a blanket coated layer deposited using any number of deposition processes including, but in no way limited to, vacuum deposition processes, spin coating processes, curtain coating processes, inkjet coating processes, and the like. In this context, the term "blanket coated" may refer to any un-patterned deposition such as one that may cover a relatively small portion of a substrate, patterned using a shadow mask for example, up to and including a deposition that may cover a relatively large portion of a substrate, which may under some circumstances include an entire substrate, depending on various factors, for example. In one exemplary embodiment, a blanket coated layer may correspond to an actual surface area on the order of a few square centimeters, for example, though the actual surface area of the blanket coated layer may vary widely. In addition, the blanket coated or un-patterned layer may include a layer such that, as deposited and without further treatment, the area of the blanket coated or un-patterned layer may be substantially larger than that of a single thin-film transistor or other semiconductor component. As used herein, the un-patterned layer may include, but is in no way limited to, an oxide semiconductor material such as zinc oxide, tin oxide, indium oxide, cadmium oxide, gallium oxide, or combinations thereof, including zinc tin oxide, zinc indium oxide, indium gallium oxide, zinc indium gallium oxide, or combinations thereof, to name but a few examples.

One or more processes or materials, such as low-temperature processes or materials may be utilized to form one or more material or component layers of a component. For example, one or more temperature sensitive materials, such as temperature sensitive substrate materials, channel layer materials or dielectric layer materials may be utilized, and this may include materials that may have characteristics such as flexibility, for example, or may include materials not suitable for use in relatively high-temperature processes. Additionally, according to various exemplary embodiments, one or more suitable processes, such as selective laser annealing; sputter deposition processes including RF (radio frequency) sputtering, DC sputtering, DC-pulsed sputtering, or reactive sputtering, wherein the substrate may be unheated or maintained at a suitably low temperature; atomic layer deposition (ALD); chemical vapor deposition processes including plasma-enhanced, electron cyclotron resonance, or inductively coupled plasma; evaporation processes, including thermal or electron-beam evaporation; or roll-coating, gravure-coating, spin-coating, dip-coating, or spray-coating, for example, may be utilized in at least one embodiment.

In the following description, for purposes of explanation, numerous specific details are set forth in order to provide a thorough understanding of the present system and method for forming a spatially selective passivation dielectric layer. It will be apparent, however, to one skilled in the art, that the present system and method may be practiced without these specific details. Reference in the specification to "one embodiment" or "an embodiment" means that a particular feature, structure, or characteristic described in connection with the embodiment is included in at least one embodiment. The appearance of the phrase "in one embodiment" in various places in the specification are not necessarily all referring to the same embodiment.

Exemplary Structure

Figure 1:
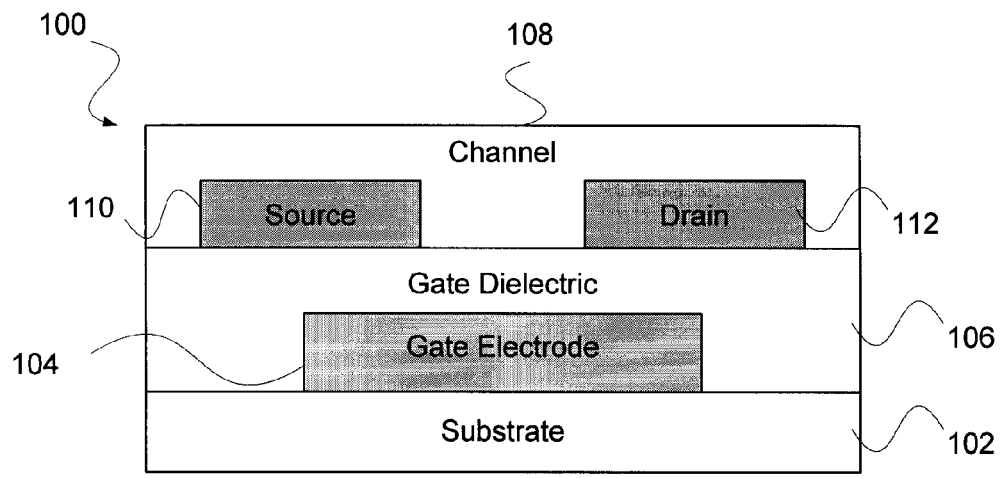
FIG. 1 is a side cross-sectional view of an embodiment of a semiconductor device with an unpatterned channel layer, such as a thin-film transistor, according to one exemplary embodiment.

FIGS. 1 and 2 illustrate the formation of an exemplary embodiment of a bottom-gate TFT formed according to the present exemplary systems and methods. According to various embodiments, the thin-film transistor (100) can form a portion of any number of electronic devices including, but in no way limited to, an active matrix display device, such as an active matrix liquid crystal display (AMLCD) device; an active matrix detection device, such as an active matrix x-ray detector device; a logic gate, such as a logic inverter; and/or an analog circuit, such as an amplifier. The thin-film transistor (100) can also be included in an optically transparent device where transparent components are used.

While FIGS. 1 and 2 illustrate a single bottom-gate transistor, the present exemplary systems and methods may be used to form any number of semiconductor apparatuses in systematic arrays or other various configurations. As shown in FIG. 1, the exemplary transistors (100) include a substrate (102), a gate electrode (104), a gate dielectric (106), a channel (108), a source electrode (110), and a drain electrode (112). Further, the gate dielectric (106) is positioned between the gate electrode (104) and the source and drain electrodes (110, 112) such that the gate dielectric (106) physically separates the gate electrode (104) from the source and the drain electrodes (110, 112). Additionally, the source and the drain electrodes (110, 112) are separately positioned, thereby forming a region between the source and drain electrodes (110, 112) for interposing the channel (108). Consequently, the gate dielectric (106) is positioned adjacent the channel (108) and physically separates the source and drain electrodes (110, 112) from the gate electrode (104). Further, the channel (108) is positioned adjacent the gate dielectric (106) and is interposed between the source and drain electrodes (110, 112). In one exemplary embodiment of the present system and method, the channel film (108) is unpatterned and/or blanket-coated over the source (110), the drain (112), and the gate dielectric (106). Although the channel layer is illustrated as having a planar top surface the channel layer may have topography in those regions where it is disposed over patterned structures such as the source and drain electrodes. As illustrated, the channel (108) is interposed between the source and the drain electrodes (110, 112), thereby providing a path for electrical conduction between the source (110) and the drain (112). According to one exemplary embodiment the unpatterned channel (108) may be made of a semiconducting oxide material such as zinc oxide, zinc tin oxide, and other similar oxide semiconductors including, but in no way limited to, zinc oxide, tin oxide, indium oxide, gallium oxide, zinc indium oxide, zinc tin oxide, indium gallium oxide, zinc indium gallium oxide, copper oxide, silver oxide, antimony oxide, and/or combinations thereof to provide a controllable electric pathway, known as the active region, configured to controllably facilitate a movement of an electrical charge between the source and drain electrodes (110, 112) via the channel (108).

With regards to FIGS. 1 and 2, the substrate (102) may include, but is in no way limited to, one or more types of plastic or one or more organic substrate materials, such as polyimides (PI), including KAPTON®; polyethylene terephthalates (PET); polyethersulfones (PES); polyetherimides (PEI); polycarbonates (PC); polyethylenenaphthalates (PEN); acrylics, including acrylates and methacrylates, such as polymethylmethacrylates (PMMA); or combinations thereof. Additionally, according to one exemplary embodiment, the substrate (102) may also comprise one or more inorganic materials, including silicon, silicon dioxide, one or more types of glass, quartz, sapphire, stainless steel and metal foils, including foils of aluminum or copper an including anodizable metal foils, or a variety of other suitable materials. Further, in at least one exemplary embodiment, wherein a substrate material is substantially comprised of one or more metals or other conductive materials, an insulator layer may be utilized in addition to the one or more metals or other conductive materials to form the substrate. A choice of substrate materials may determine certain characteristics or tolerances that may influence the available semiconductor fabrication processes that are suitable for use with a particular substrate material. For example, according to one exemplary embodiment, organic substrate materials may be more sensitive to heat and as such may be more suitable for use with lower temperature processes than those that may be suitable for use with inorganic substrates under certain circumstances. Choice of substrate material may depend on a variety of factors including, but in no way limited to, heat sensitivity, cost, flexibility, durability, resistance to failure, surface morphology, chemical stability, optical transparency, barrier properties, etc.

FIG. 2 is a cross-sectional side view of the exemplary thin film transistor (200) of FIG. 1 including a patterned dielectric (214) and an unpatterned dielectric (216) formed on the unpatterned channel layer (108), according to one exemplary embodiment. According to the present exemplary systems and methods, a patterned dielectric (214) may be deposited on the channel (108) back-side of the TFT, to define the active device region of the unpatterned channel (108). As used herein, and in the appended claims, the term "channel back-side" is meant to be understood as the side of the unpatterned channel layer (108) opposite the gate dielectric (106).

The patterned dielectric (214) is electrically and chemically compatible with the channel layer (108) material, and ensures that the necessary electrical functionality of the active region is maintained. The function performed by the patterned dielectric (214) may be referred to as passivation of the TFT channel layer (108). After deposition of the patterned dielectric (214), a second dielectric (216) is deposited over the patterned dielectric (214) and the exposed portions of the unpatterned channel layer (108); the second dielectric (216) serves to "deactivate" the portions of the unpatterned channel layer (108) that are not covered (passivated) by the patterned dielectric (214).

For TFTs based on zinc tin oxide and other similar oxide semiconductors (e.g., zinc oxide, tin oxide, indium oxide, gallium oxide, zinc indium oxide, indium gallium oxide, zinc indium gallium oxide, combinations thereof, etc.), and for TFTs in general, the performance of the device is highly dependent on the nature of the channel back-side (i.e., the side opposite the gate dielectric) interface. Certain back-side passivation dielectrics provide for excellent device performance, referred to here as "good" passivation dielectrics, while others can effectively destroy device functionality, referred to herein as "poor" passivation dielectrics. This difference in performance, dependent on the selected back-side passivation dielectric, can be used to "electrically" pattern the unpatterned channel film (108) without the use of conventional "physical" patterning (e.g., photolithography, etch, lift-off, etc.) of the channel material, as described below.

The localized channel film deactivation provided by interaction with the electrically "poor" second dielectric (216) occurs in regions where the second dielectric is in contact with the unpatterned channel film (108), and generally includes rendering the channel film in these regions highly resistive and reducing the ability to induce free carriers via the field effect. Such "deactivation" may be a result of one or more of several possible mechanisms, including, but in no way limited to, (1) mid-bandgap trap states at the channel (108)/second dielectric (216) interface, and (2) mid-bandgap trap states in the channel (108) bulk (due, for example, to chemical reaction between the channel (108) and the second dielectric (216), e.g., diffusion of one or more components of the second dielectric (216) into the channel (108), and/or vice versa); in both cases, the mid-bandgap states immobilize (trap) otherwise mobile carriers (e.g., electrons) in the film, thereby preventing their participation in conduction within the effected portion(s) of the channel layer (108).

As noted above, suitable materials for the "good" patterned dielectric layer (214) that is patterned to define and protect device regions may include materials that are known to act as good TFT gate dielectric materials. As used in the present specification, and in the appended claims, the term "good" used in context with a dielectric material defines a back-side passivation dielectric that does not electrically interfere with the desired function of a TFT channel during device operation, and effectively protects the TFT from the deactivating features of the electrically "poor" second dielectric (216). Examples of possible candidates for "good" passivation dielectric (214) materials include materials know to provide reasonable gate dielectrics, such as, but in no way limited to, silicon oxides ($SiO_x$), silicon nitrides ($SiN_x$), aluminum oxides ($AlO_x$), hafnium oxides ($HfO_x$), tantalum oxides ($TaO_x$), and combinations thereof; other exemplary candidates include, but are not limited to germanium oxides ($GeO_x$), calcium fluorides ($CaF_x$), and strontium fluorides ($SrF_x$).

In contrast to the above mentioned "good" passivation dielectric layer (214), materials suitable for the electrically "poor" second dielectric (216) material layer are configured to provide "deactivation" of the unpatterned oxide semiconductor channel layer (108), as described above. As used in the present specification, and the appended claims, the term "poor" when used in context with a dielectric material defines a dielectric that, when placed in contact with the channel layer (108), results in negligible channel conduction for any voltage within the range of interest for a particular device, thus effectively "deactivating" any portion of the unpatterned channel region in contact with the electrically "poor" second dielectric (216). According to one exemplary embodiment, suitable candidates for the "poor" dielectric material layer are configured to provide "deactivation" of the oxide semiconductor channel layer, as described above. Specifically according to a zinc tin oxide embodiment (with composition corresponding to a Zn:Sn ratio of about 2:1), the application of zinc sulfide or cerium oxide to the channel (108) back surface effectively "deactivates" the TFT channel. Alternative materials may also be used to provide this effect including, but in no way limited to, sulfides such as barium sulfide or strontium sulfide. In regions where this unpatterned dielectric (216) contacts the unpatterned channel layer (108), the channel layer (108) is electrically "deactivated". In an alternate process, a partial etching, plasma treatment, or similar process may be employed to effectively "damage" the portions of the unpatterned channel surface (108) that remain exposed after deposition and patterning of the patterned dielectric (214). Following this step, second dielectric (216) is deposited to cap the "deactivated" channel regions and to act as an interlevel dielectric. In this exemplary process, the patterned dielectric layer (214) protects the underlying channel layer (108), corresponding to TFT active regions, from electrical "deactivation" during the partial etching or similar process.

Though the exemplary TFT (200) has been described above with regard to a particular structure, it should be noted that the thin-film transistors may be of any type or structure, including but not limited to, horizontal, vertical, coplanar electrode, staggered electrode, top-gate, bottom-gate, single-gate, and double-gate, to name but a few. As used herein, a "coplanar electrode configuration" is meant to be understood as any transistor structure where the source and drain electrodes are positioned on the same side of the channel layer as is the gate electrode. Further, as used herein, a "staggered electrode configuration" is meant to be understood as any transistor structure where the source and drain electrodes are positioned on the opposite side of the channel layer as is the gate electrode.

Further, while the present exemplary system and method are described herein in the context of a thin-film transistor (TFT), the one or more material or component layers, in combination with one or more other material or component layers may form any number of electrical components including, but in no way limited to thin-film transistors (TFTs), capacitors, diodes, resistors, photovoltaic cells, insulators, conductors, optically active components, or the like. Components such as TFTs, in particular, may, for example, be utilized in components including smart packages and display components including, for example, radio frequency identification (RFID) tags and electroluminescent and liquid crystal displays (LCD), such as active matrix liquid crystal display (AMLCD) devices, for example.

Figure 3:
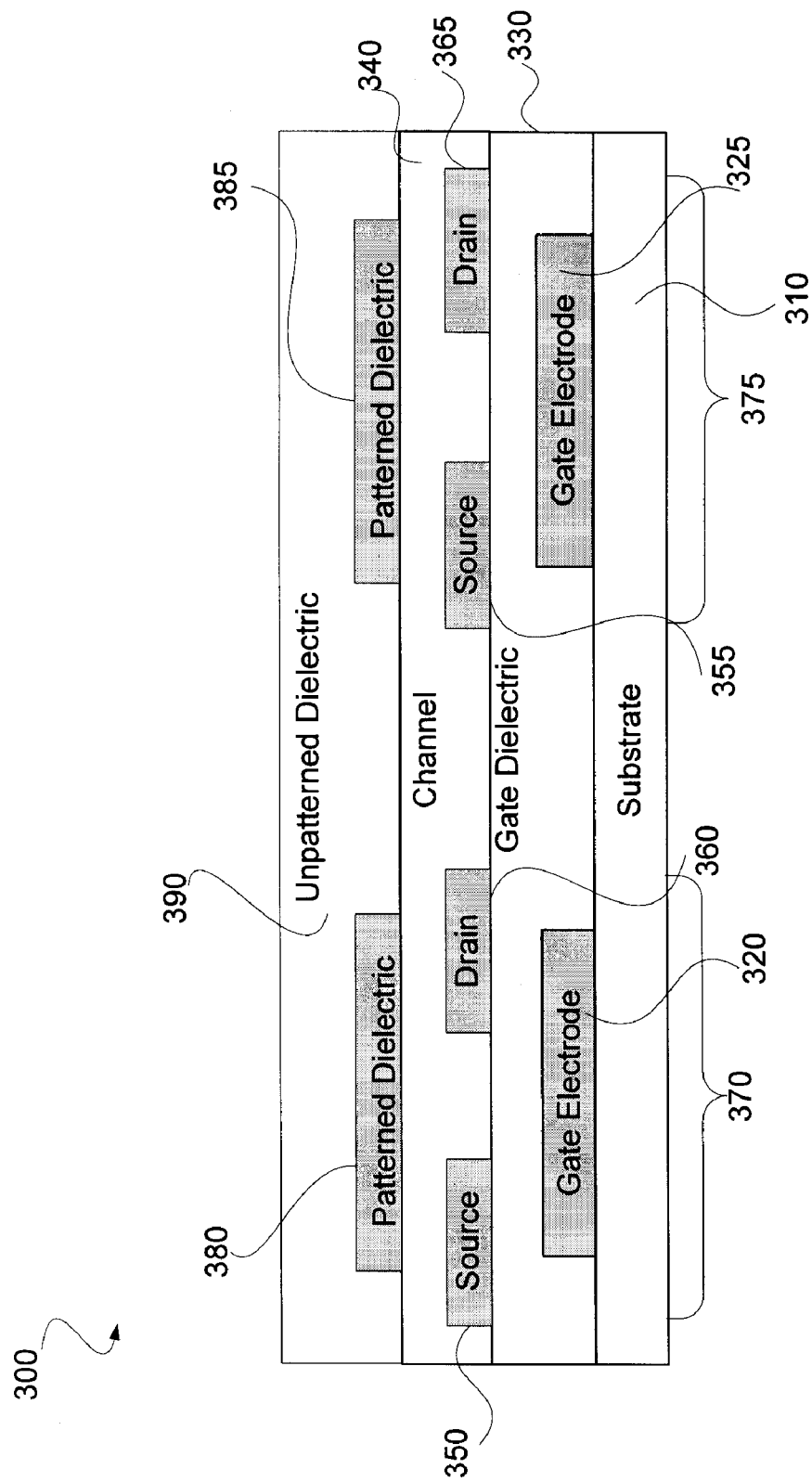
FIG. 3 illustrates a side cross-sectional view of a semiconductor device array structure, according to one exemplary embodiment.

FIG. 3 illustrates a cross-sectional view of an exemplary semiconductor device array structure (300), according to one exemplary embodiment. With regard to FIG. 3, the exemplary array structure (300) may include a first layer (310), such as a substrate layer. Similar to the substrate layers previously described, the first layer (310) may include, but is in no way limited to, one or more types of plastic or one or more organic substrate materials such as polyimides (PI), including KAPTON®; polyethylene terephthalates (PET); polyethersulfones (PES); polyetherimides (PEI); polycarbonates (PC); polyethylenenaphthalates (PEN); acrylics, including acrylates, and methacrylates, such as polymethylmethacrylates (PMMA); or combinations thereof. Alternatively, the first layer (310) may include, but is no way limited to, one or more inorganic materials, including silicon, silicon dioxide, one or more types of glass, stainless steel and metal foils, including foils of aluminum and copper. Additionally, in at least one exemplary embodiment, wherein the first layer (310) includes one or more metals or other conductive materials, an insulator layer (not shown) may be utilized in addition to the one or more metals or other conductive materials to form a first layer (310).

Further, as illustrated in FIG. 3, the exemplary array structure (300) includes a first gate electrode (320) and a second gate electrode (325). The exemplary array structure (300) may further include a second layer (330), such as a gate insulator layer, which may comprise silicon dioxide or other materials including, but in no way limited to, inorganic dielectrics such as zirconium oxide, tantalum oxide, yttrium oxide, lanthanum oxide, silicon oxide, aluminum oxide, hafnium oxide, barium zirconate titanate, barium strontium titanate, silicon nitride, or silicon oxynitride, as just a few examples. In addition, the second layer (330) may include organic dielectrics such as curable monomers, including UV curable acrylic monomers, UV curable monomers, thermal curable monomers; acrylic polymers; polymer solutions such as melted polymers or oligomer solutions; poly methyl methacrylate, poly vinylphenol; benzocyclobutene; or one or more polyimides, to name but a few examples. According to one exemplary embodiment, the second layer (330) may have a thickness that may under some circumstance be in a range of approximately 20 to 1000 nm. Also, the second layer (330) may under some circumstance comprise multiple sub-layers, including one or more inorganic dielectric or organic dielectric layers, though other exemplary materials may be used to form a gate insulator layer.

Moreover, as illustrated in FIG. 3, the exemplary array structure (300) may further include an un-patterned and/or blanket coated channel layer (340), as described previously. According to one exemplary embodiment, the un-patterned channel layer (340) of the exemplary array structure (300) may further include a first and a second source electrode (350, 355) and a first and a second drain electrode (360, 365), as shown. The source (350, 355) and drain electrodes (360, 365) may be formed within the same un-patterned channel layer (340) that includes semiconductive active or operational regions or may be formed in an adjacent patterned layer of suitable conductive material. Although other materials may be used, the first and second source electrodes (350, 355) and the first and second drain electrodes (360, 365) may comprise a conductive oxide material such as n-type doped indium oxide, tin oxide, zinc oxide, or the like, or a metal such as aluminum, silver, copper, gold, titanium, tantalum, chromium, nickel, molybdenum, tungsten, or the like.

According to one exemplary embodiment, the first gate electrode (320), the first source electrode (350), the first drain electrode (360), and the gate dielectric layer (330), may function as a first transistor (370) of the exemplary array structure (300), such that the semiconductive active region defined by the gate, source and drain electrodes may function as a channel region. Likewise, the second gate electrode (325), the second source electrode (355), the second drain electrode (365), and the gate insulator layer (330), may function as a second transistor (375), such that the second semiconductive active or operational region may function as a second channel region. As illustrated, the exemplary array structure (300) may achieve effective electrical isolation between the first transistor (370) and the second transistor (375) by depositing patterned "good" passivation dielectrics (380, 385) over the active or operational regions, and depositing an unpatterned layer of "poor" dielectric (390) between them, thereby electrically isolating the first and second transistors as discussed above.

Exemplary Formation

Figure 4:
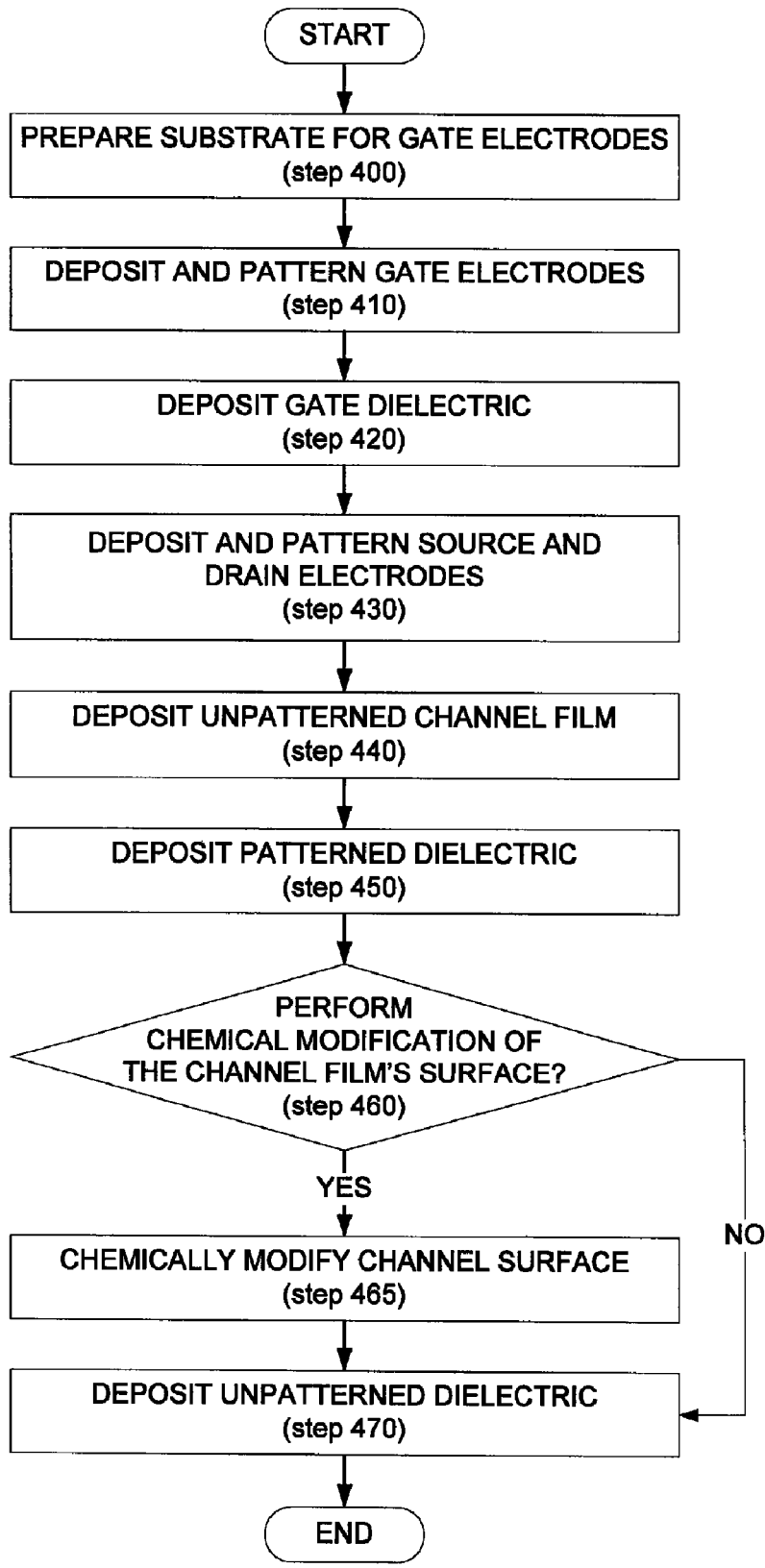
FIG. 4 is a flow chart illustrating an exemplary method for using spatially selective activation/deactivation of un-patterned TFT channel film using patterned passivation dielectrics, according to one exemplary embodiment.

FIG. 4 illustrates an exemplary method for using patterned passivation dielectric to cause spatially selective activation/deactivation of an unpatterned TFT channel film, according to one exemplary embodiment. As illustrated in FIG. 4, the exemplary method begins by first preparing a substrate to receive gate electrodes (step 400). Once the substrate is prepared, interconnect lines and gate electrodes may be formed by any number of known formation methods (step 410). The dielectric layer acting as a gate dielectric may then be formed as a film over the desired substrate and electrodes (step 420). With the gate dielectric layer formed, desired source and drain electrodes and interconnect lines may be formed using any suitable formation method (step 430). An unpatterned channel layer is then formed (step 440) over the source and drain electrodes, as well as the exposed gate dielectric. Next, a patterned layer of passivation dielectric is deposited to protect the active or operational regions of the device (450). With the patterned dielectric deposited, the user may optionally configure the manufacturing process to include a step to chemically modify the channel film's surface (step 460). If a chemical modification is desired (YES, step 460) it may be done by performing a partial etching, plasma process, or the like to damage the surface of the channel film in such a way as to "deactivate" the channel in the exposed regions (step 465). The last step of the present exemplary method calls for an unpatterned passivation dielectric layer to be formed (step 470), thereby deactivating the interfacing channel layer. Further details of each of the above-mentioned steps will be described in further detail below.

As illustrated, the above-mentioned method begins by first preparing the desired substrate to receive gate electrodes (step 400). According to one exemplary embodiment, any number of the above-mentioned components may be formed on the desired substrate to form an integrated circuit, prior to the deposition of the gate dielectric layer. More specifically, according to one exemplary embodiment, all or part of an active matrix display backplane may be formed on the desired substrate prior to deposition of the gate dielectric layer.

Once the substrate is prepared, interconnect lines and gate electrodes may be formed by any number of known formation methods including, but in no way limited to, vacuum deposition, inkjet printing, microcontact printing, photolithography, imprint lithography, laser ablation, laser annealing, thermal annealing, and the like (step 410).

Upon completion of the control lines and gate electrodes, the gate dielectric layer is formed on the desired substrate (step 420). According to one exemplary embodiment, the formation of the gate dielectric layer on the desired substrate may be performed by any appropriate deposition processes including, but in no way limited to, a vacuum deposition process. More particularly, appropriate vacuum deposition processes that may be used include, but are in no way limited to, RF (radio frequency) sputtering, DC sputtering, DC-pulsed sputtering, reactive sputtering, thermal evaporation, electron-beam evaporation, chemical vapor deposition (CVD), or atomic layer deposition (ALD). Additionally, according to one exemplary embodiment, it may be useful to form a multi-layer stack, e.g., two or more layers of different dielectrics, with the multi-layer stack comprising the gate dielectric layer.

According to one exemplary embodiment, the gate dielectric layer may be formed using sputter deposition at a sufficiently low power so as to avoid appreciable substrate heating, thereby maintaining compatibility with low-cost, low-temperature flexible substrate materials; alternatively, active cooling may be employed to maintain a desired substrate temperature. In addition, the deposition of the gate dielectric layer may be carried out with a heated or unheated substrate, in an approximately 90% argon and 10% oxygen environment and at a pressure of approximately 5 mTorr, for example.

As mentioned previously, the gate dielectric layer may be formed from any number of materials including, but in no way limited to, inorganic dielectrics such as silicon oxide, zirconium oxide, tantalum oxide, yttrium oxide, lanthanum oxide, silicon oxide, aluminum oxide, hafnium oxide, barium zirconate titanate, barium strontium titanate, silicon nitride, or silicon oxynitride. In addition, the gate dielectric layer may include organic dielectrics such as curable monomers, including UV curable acrylic monomers, UV curable monomers, thermal curable monomers; acrylic polymers; polymer solutions such as melted polymers or oligomer solutions; poly methyl methacrylate, poly vinylphenol; benzocyclobutene; or one or more polyimides, to name but a few examples. Also, the gate dielectric layer may under some circumstance comprise multiple sub-layers, including one or more inorganic dielectric or organic dielectric layers, though other materials may be used to form a gate insulator layer and will be understood by one of ordinary skill. According to one exemplary embodiment the gate dielectric may comprise aluminum oxide with a thickness of about 50-500 nm.

Source and drain electrodes are formed on the surface of the unpatterned gate dielectric layer (step 430) using any of the same methods used in the formation of the gate electrodes or gate dielectric, above.

Once the source and drain electrodes have been formed (step 430), an unpatterned channel layer is deposited (step 440). This layer may be deposited by any number of known deposition methods including, but not limited to, any of the methods described above in conjunction with the deposition of the gate dielectric layer. According to one exemplary embodiment, an active or operational region is now defined in the channel by the relative alignment of drain, source and gate electrodes.

The present system and method continue by forming a patterned passivation dielectric (step 450). The passivation dielectric is deposited over the channel film and patterned so as to cover only the intended active or operational regions (the TFT channel regions). This can be done using deposition and patterning techniques as describe above and including, but not limited to, photolithography, imprint lithography, laser ablation, microcontact printing, inkjet printing, various vacuum deposition methods, and the like.

After the first passivation dielectric layer has been deposited (step 450) the user may optionally configure the manufacturing process to include a step to chemically modify the channel film's surface (step 460). If a chemical modification is desired (YES, step 460) it may be done by performing a partial etching or the like to damage the surface of the channel film in such a way as to deactivate the channel (step 465). This is an optional step, but may be used in order to further ensure the electrical isolation of the thin-film devices.

The final step of processing requires a second unpatterned passivation dielectric to be deposited over the surface of the device (step 470). The second unpatterned passivation dielectric is blanket coat deposited, which may be accomplished using any number of methods including, but not limited to, vacuum deposition processes, spin coating processes, curtain coating processes, inkjet coating processes, and the like. The patterned passivation dielectric protects device regions, while the exposed portions of the channel film are "deactivated" due to interaction with the unpatterned passivation dielectric and/or chemical modification in optional step 465.

For ease of explanation, the above description of FIG. 4 generally illustrates the steps of an exemplary formation method. However, any number of additional steps currently used in TFT processing may be used including, but in no way limited to thermal annealing steps, impurity doping, and the like.

As mentioned previously, the above-mentioned method provides for electrically patterning an unpatterned channel region. Additionally, the step of coating an unpatterned dielectric layer over the patterned passivation dielectric layer and the unpatterned channel layer electrically isolates adjacent TFT's.

In conclusion, the present exemplary system and method for spatially selecting the active/inactive regions of an unpatterned TFT channel film employs a process that may simplify the process of electrically isolating TFTs, by providing an alternative to the direct patterning of the TFT channel layer. The present exemplary system offers multiple advantages over the current technology. First, the disclosed system and method adds process latitude/flexibility in fabricating circuits based on oxide semiconductor TFTs, especially on low-temperature flexible substrates. Second, physical patterning of the channel film may be avoided by patterning an overlying dielectric layer as disclosed above. While not advantageous in all cases, it may often be preferable to avoid direct physical patterning, such as via conventional etch processes, of the relatively sensitive channel layer.

The preceding description has been presented only to illustrate and describe exemplary embodiments of the present system and method. It is not intended to be exhaustive or to limit the system and method to any precise form disclosed. Many modifications and variations are possible in light of the above teaching. It is intended that the scope of the system and method be defined by the following claims.

What is claimed is:

1. A thin-film device comprising:
    a plurality of thin-film device components defining an operational region of said thin-film device;
    an unpatterned channel portion disposed adjacent to said plurality of thin-film device components; and
    a patterned passivation dielectric selectively disposed on said unpatterned channel portion to electrically pattern an active region of said unpatterned channel portion.

2. The thin-film device of claim 1, wherein said patterned passivation dielectric comprises:
    a first dielectric disposed adjacent to said unpatterned channel portion at said operational region, said first dielectric being configured to provide an electrically good interface with said unpatterned channel portion; and
    a second dielectric disposed over said first dielectric and over exposed portions of said unpatterned channel said second dielectric being configured to provide an electrically poor interface with said unpatterned channel portion.

3. The thin-film device of claim 2, wherein said unpatterned channel portion comprises an oxide semiconductor material.

4. The thin-film device of claim 3, wherein said oxide semiconductor material comprises a zinc tin oxide.

5. The thin-film device of claim 4, wherein said zinc tin oxide comprises a composition characterized by a Zn:Sn atomic ratio of about 2:1.

6. The thin-film device of claim 3, wherein said oxide semiconductor comprises one of zinc oxide, tin oxide, indium oxide, gallium oxide, zinc tin oxide, zinc indium oxide, tin indium oxide, indium gallium oxide, zinc gallium oxide, or zinc indium gallium oxide.

7. The thin-film device of claim 3, wherein said first dielectric comprises one of a silicon oxide, a silicon nitride, an aluminum oxide, a hafnium oxide, a tantalum oxide, a germanium oxide, a calcium fluoride, or a strontium fluoride.

8. The thin-film device of claim 2, wherein said second dielectric deactivates portions of said unpatterned channel portion not covered by said first dielectric.

9. A method of forming thin-film device comprising:
    forming a plurality of thin-film device components defining an operational region of said thin-film device;
    forming an unpatterned channel portion disposed adjacent to said plurality of thin-film device components; and
    forming a patterned passivation dielectric selectively disposed on said unpatterned channel portion to electrically pattern an active region of said unpatterned channel portion.

10. The method of claim 9, wherein forming said patterned passivation dielectric comprises:
    forming a first dielectric disposed adjacent to said unpatterned channel portion at said operational region, said first dielectric being configured to provide an electrically good interface with said unpatterned channel portion; and
    forming a second dielectric disposed over said first dielectric and over exposed portions of said unpatterned channel, said second dielectric being configured to provide an electrically poor interface with said unpatterned channel portion.

11. The method of claim 10, wherein said unpatterned channel portion comprises an oxide semiconductor material.

12. The method of claim 11, wherein said oxide semiconductor material comprises a zinc tin oxide.

13. The method of claim 12, wherein said zinc tin oxide comprises a composition characterized by a Zn:Sn atomic ratio of about 2:1.

14. The method of claim 11, wherein said oxide semiconductor comprises one of zinc oxide, tin oxide, indium oxide, gallium oxide, zinc tin oxide, zinc indium oxide, tin indium oxide, indium gallium oxide, zinc gallium oxide, or zinc indium gallium oxide.

15. The method of claim 11, wherein said first dielectric comprises one of a silicon oxide, a silicon nitride, an aluminum oxide, a hafnium oxide, a tantalum oxide, a germanium oxide, a calcium fluoride, or a strontium fluoride.

16. The method of claim 10, wherein said second dielectric deactivates portions of said unpatterned channel portion not covered by said first dielectric.

* * * * *